(12) United States Patent
Kawahara et al.

(10) Patent No.: US 9,499,002 B2
(45) Date of Patent: Nov. 22, 2016

(54) RESIN PRINTING PLATE PRECURSOR FOR LASER ENGRAVING

(71) Applicant: TORAY Industries, Inc., Tokyo (JP)

(72) Inventors: Hiroyuki Kawahara, Okazaki (JP); Tsutomu Abura, Okazaki (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 14/765,270

(22) PCT Filed: Jan. 20, 2014

(86) PCT No.: PCT/JP2014/050954
§ 371 (c)(1),
(2) Date: Jul. 31, 2015

(87) PCT Pub. No.: WO2014/129243
PCT Pub. Date: Aug. 28, 2014

(65) Prior Publication Data
US 2015/0367668 A1    Dec. 24, 2015

(30) Foreign Application Priority Data
Feb. 20, 2013 (JP) ................................. 2013-030778

(51) Int. Cl.
| | | |
|---|---|---|
| *B41C 1/05* | (2006.01) | |
| *B41N 1/12* | (2006.01) | |
| *G03F 7/037* | (2006.01) | |
| *B29B 13/00* | (2006.01) | |
| *B29C 35/08* | (2006.01) | |
| *B29K 31/00* | (2006.01) | |
| *B29L 31/00* | (2006.01) | |

(52) U.S. Cl.
CPC ................ *B41N 1/12* (2013.01); *B29B 13/00* (2013.01); *B29C 35/0805* (2013.01); *B41C 1/05* (2013.01); *G03F 7/037* (2013.01); *B29C 2035/0838* (2013.01); *B29K 2031/04* (2013.01); *B29L 2031/767* (2013.01)

(58) Field of Classification Search
None
See application file for complete search history.

(56) References Cited

U.S. PATENT DOCUMENTS

| | | | | |
|---|---|---|---|---|
| 4,576,897 A | * | 3/1986 | Fujikawa | ................ G03F 7/092 430/273.1 |
| 2007/0065751 A1 | * | 3/2007 | Katayose | ................ G03F 7/033 430/270.1 |
| 2011/0318689 A1 | * | 12/2011 | Furukawa | ................ C08F 2/38 430/281.1 |

FOREIGN PATENT DOCUMENTS

| | | |
|---|---|---|
| JP | 11-65115 A | 3/1999 |
| JP | 11065115 A * | 3/1999 |
| JP | 2001-272776 A | 10/2001 |
| JP | 2012-030368 A | 2/2012 |

OTHER PUBLICATIONS

International Search Report issued in PCT/JP2014/050954 dated Apr. 8, 2014.

* cited by examiner

*Primary Examiner* — Jill Culler
*Assistant Examiner* — Michael Robinson
(74) *Attorney, Agent, or Firm* — Birch, Stewart, Kolasch & Birch, LLP

(57) ABSTRACT

It is an object of the present invention to provide a resin printing plate precursor for laser engraving that is able to form a relief by laser engraving, the relief having excellent image reproducibility, and moreover has toughness and improved printing durability. The present invention is a resin printing plate precursor for laser engraving comprising a substrate and a resin layer on the substrate, the resin layer containing:
(A) a modified partially saponified polyvinyl acetate having reactive groups in its side chain;
(B) a polyamide having basic nitrogen;
(C) a compound having a 5- to 7-membered ring and a polymerizable ethylenic double bond; and
(D) a photopolymerization initiator.

10 Claims, No Drawings

RESIN PRINTING PLATE PRECURSOR FOR LASER ENGRAVING

TECHNICAL FIELD

The present invention relates to a resin printing plate precursor for laser engraving, and particularly relates to a resin printing plate precursor for laser engraving that has improved printing durability and provides improved print quality and a method of manufacturing a printing plate.

BACKGROUND ART

As a method of forming a relief plate by forming projections and depressions on a surface, the method what is called "analog plate-making" is well known, in which, using a photosensitive elastomer composition or a photosensitive resin composition, the composition is exposed to ultraviolet light through an original film to selectively cure portions of the photosensitive resin composition that are to form an image, and uncured portions of the photosensitive resin composition are removed with developing solution.

The analog plate-making often requires an original film made of silver halide material, and accordingly, the time and cost to produce the original film are needed. In addition, developing the original film requires chemical treatment, and disposal of waste fluid from development is also required, which is disadvantageous in terms of environmental sanitation.

As a method for solving the problems involved in the analog plate-making, there is disclosed a resin letterpress printing plate precursor comprising a photosensitive resin layer and a laser-sensitive mask layer element provided thereon that is able to form an image mask in situ (see, for example, Patent Documents 1 and 2). The method of making such a plate precursor is a plate-making method in which laser radiation is performed based on image data controlled using a digital device, forming an image mask in situ from a mask layer element, after which, similarly to the analog plate-making, exposure to ultraviolet light through the image mask is performed, or a photosensitive resin layer and the image mask are developed away. This method is called "Computer-To-Plate (CTP) method" in the field of resin letterpress printing plates. The CTP method has solved the above-described problems involved in the process for producing an original film, but has a problem of disposal of waste fluid resulting from the development of the photosensitive resin layer.

As an alternative method for solving the problems involved in the developing process and the waste fluid from development, many kinds of plate-making by direct engraving with a laser, what is called "laser engraving" have been proposed. Laser engraving, which forms projections and depressions, i.e., a relief, by literally engraving with a laser, is advantageous in that the shape of the relief can be freely controlled unlike relief formation using an original film. For example, portions to reproduce a reverse text on a material to be printed may be engraved deeply, and portions to reproduce a fine dot can be engraved into a shape with shoulders so that the dot does not fall over under printing pressure.

Patent Documents 3 to 5 disclose a resin letterpress printing plate precursor that can be engraved by a laser, or a resin letterpress printing plate produced by laser engraving. Patent Document 8 discloses a resin composition for laser engraving containing a partially saponified polyvinyl acetate as a polymer and a polymerizable double bond.

The partially saponified polyvinyl acetate and derivatives thereof, however, are fragile upon repeated impacts during printing, causing a problem of, for example, crack occurrence in a relief during printing.

As a method for solving the above-described problem, addition of a polyvinyl acetate derivative and a polyamide having basic nitrogen is proposed, for example, in Patent Documents 6 and 7. This method, however, is still not at a satisfactory level regarding the crack occurrence in a relief upon repeated impacts during printing under pulling tension exerted when the relief is wrapped around a cylinder drum of a printer.

Also known is to introduce reactive groups used in a photosensitive resin composition for a printing plate into the side chain of a partially saponified polyvinyl acetate (Patent Document 8).

PRIOR ART DOCUMENTS

Patent Documents

Patent Document 1: JP 07-509789 A (EP 0654151A)
Patent Document 2: JP 09-171247 A
Patent Document 3: JP 11-170718 A (p. 4)
Patent Document 4: JP 2000-168253 A (pp. 2-6)
Patent Document 5: JP 2001-328365 A (pp. 2-9)
Patent Document 6: JP 11-65115 A
Patent Document 7: JP 2001-272776 A
Patent Document 8: JP 2006-2061 A
Patent Document 9: JP 2007-79494 A

SUMMARY OF THE INVENTION

Problems to be Solved by the Invention

In view of the above-described circumstances, an object of the present invention is to provide a resin printing plate precursor for laser engraving that is able to form a relief having excellent reproducibility by laser engraving, and moreover has toughness and improved printing durability. Another object of the present invention is to provide a resin printing plate precursor for laser engraving, from which residues, when attached to the relief after laser engraving, can be easily removed.

Means for Solving the Problems

To achieve the above objects, the present invention has the following structure:

(1) A resin printing plate precursor for laser engraving comprising a substrate and a resin layer on the substrate, the resin layer containing:
  (A) a modified partially saponified polyvinyl acetate having reactive groups in its side chain;
  (B) a polyamide having basic nitrogen;
  (C) a compound having a 5- to 7-membered ring and a polymerizable ethylenic double bond; and
  (D) a photopolymerization initiator.

In a preferred aspect, the present invention provides a plate precursor having the following structure.

(2) The resin printing plate precursor for laser engraving described above, wherein the compound (C) has a molecular weight of 300 or less.

(3) The resin printing plate precursor for laser engraving according to any one of the above, wherein the compound (C) has at least one functional group selected from hydroxyl, carboxyl, and amino.

(4) The resin printing plate precursor for laser engraving according to any one of the above, wherein the 5- to 7-membered ring in the compound (C) comprises a heterocyclic ring.

(5) The resin printing plate precursor for laser engraving described above, wherein the 5- to 7-membered ring in the compound (C) comprises a heterocyclic aliphatic ring.

(6) The resin printing plate precursor for laser engraving according to any one of the above, wherein the compound (A) comprises a modified partially saponified polyvinyl acetate having a structure in which carboxyl groups are introduced into a polymer side chain by reacting a partially saponified polyvinyl acetate with an acid anhydride, and reactive groups are introduced by reacting the carboxyl groups with an unsaturated epoxy compound.

(7) The resin printing plate precursor for laser engraving according to any one of the above, wherein the compound (A) has a structure in which an unsaturated epoxy compound is added to an anionically modified polyvinyl alcohol having a degree of saponification of 60 to 90 mol % obtained by saponifying a copolymer of vinyl acetate with an unsaturated carboxylic acid or a salt thereof, or with an unsaturated carboxylic ester.

(8) The resin printing plate precursor for laser engraving according to any one of the above, wherein the compound (A) has a structure formed by reaction of a partially saponified polyvinyl acetate with an acrylic compound having an N-methylol group.

(9) The resin printing plate precursor for laser engraving according to any one of the above, wherein the compound (B) comprises a piperazine ring.

Furthermore, the present invention also provides those having the following structure that utilize the resin printing plate precursor for laser engraving according to any one of the above.

(10) A cross-linked resin printing plate precursor for laser engraving provided by cross-linking the resin printing plate precursor for laser engraving according to any one of the above.

(11) A method of manufacturing a printing plate, comprising the steps of:
cross-linking the resin printing plate precursor for laser engraving according to any one of the above to provide a cross-linked resin printing plate precursor for laser engraving; and
applying patterned laser radiation to the cross-linked plate precursor to engrave a relief on the resin layer.

(12) The method of manufacturing a printing plate according to the above, comprising the step of rinsing the relief with water or a liquid containing water subsequently to the above steps.

Effects of the Invention

According to the present invention, a printing plate is provided, which is less likely to experience a relief crack even when subjected to repeated impacts in printing under pulling tension exerted when the relief is wrapped around a cylinder drum of a printer. Furthermore, a printing plate is provided, from which residues, if attached to the relief after laser engraving, can be easily removed.

MODE FOR CARRYING OUT THE INVENTION

Embodiments of the present invention will now be described.

The component (A) contained in the resin layer is a modified partially saponified polyvinyl acetate having reactive groups in its side chain. "Reactive group" herein refers to a functional group that can be polymerized by radical reaction to cross-link the modified partially saponified polyvinyl acetate. Common examples of such a functional group include an ethylenic double bond, a vinyl group, and a (meth)acryloyl group.

Examples of the method for introducing such reactive groups into the side chain of a partially saponified polyvinyl acetate include the following methods.

A partially saponified polyvinyl acetate is reacted with an acid anhydride to introduce carboxyl groups into a polymer side chain starting from a hydroxyl group of the partially saponified polyvinyl acetate. The carboxyl groups are reacted with an unsaturated epoxy compound typified by glycidyl methacrylate to introduce reactive groups. Alternatively, a copolymer of vinyl acetate and an unsaturated carboxylic acid or a salt thereof, or a copolymer of vinyl acetate and an unsaturated carboxylic ester is partially saponified, and carboxyl groups of the polymer are reacted with an unsaturated epoxy compound. In particular, the partially saponified polyvinyl acetate obtained by the former method is preferred because the effect of the present invention, i.e., high relief reproducibility by laser engraving is fully exerted.

Such reactive groups are preferably contained in the compound (A) in an amount of 0.08 to 0.72 mol/kg, more preferably 0.12 to 0.36 mol/kg. A less amount of reactive groups tends to cause relief defects during printing or rinsing. Too large an amount of reactive groups increases the crosslink density of the resin after being cross-linked, often resulting in a fragile resin layer with poor flexibility. The modified partially saponified polyvinyl acetate (A) having reactive groups thus obtained preferably has at least the following structural units (I), (II), and (III).

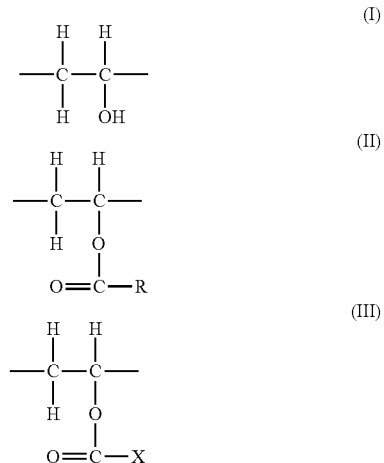

(In the above Formulae (I) to (III), R is a $C_1$-$C_{20}$ hydrocarbon group, and X is a functional group having an unsaturated carbon-carbon bond at the terminal.)

The number average degree of polymerization of the compound (A) is preferably in the range of 300 to 2000, more preferably 500 to 1000. Too low a number average degree of polymerization tends to reduce the water resistance to aqueous ink used in printing. Too high a number average degree of polymerization tends to significantly increase the solution viscosity of a resin layer in the process of providing the resin layer on a substrate, making it difficult to form the resin layer.

Another method for introducing reactive groups into a partially saponified polyvinyl acetate is to react a partially saponified polyvinyl acetate with an acrylic compound having an N-methylol group to thereby introduce reactive groups into the side chain of the partially saponified polyvinyl acetate. The amount of the acrylic compound having an N-methylol group is preferably in the range of 2 to 40 parts by mass, more preferably 5 to 30 parts by mass, based on 100 parts by mass of the partially saponified polyvinyl acetate. If the amount of the acrylic compound having an N-methylol group is more than 40 parts by mass, the resin after being cross-linked has a high crosslink density, often resulting in a fragile resin layer with poor flexibility. If the amount of the acrylic compound is less than 2 parts by mass, effects such as prevention of relief defects during rinsing, which is improved by reaction of the reactive groups, are less likely to occur.

Examples of the acrylic compound having an N-methylol group include N-methylolacrylamide, N-methylolmethacrylamide, N-methyl-N-methylolacrylamide, N-methyl-N-methylolmethacrylamide, N-ethyl-N-methylolacrylamide, and N-ethyl-N-methylolmethacrylamide. In particular, N-methylolacrylamide and N-methylolmethacrylamide are preferred. These may be used alone or in combination of two or more.

The compound (B) of the present invention, i.e., a polyamide having basic nitrogen can solve the problem of the relief defects during rinsing or printing often caused by using the compound (A). The polyamide having basic nitrogen is a polymer containing basic nitrogen at some part of the main chain or side chain. Basic nitrogen is a nitrogen atom constituting an amino group that is not an amide group. Examples of such a polyamide include polyamides having a tertiary amino group in the main chain. The polyamide having basic nitrogen can be obtained by performing a reaction such as condensation polymerization or polyaddition using a monomer having basic nitrogen alone or with any other monomer. As the basic nitrogen, piperazine and N,N-dialkylamino are preferred, and piperazine is more preferred. Examples of the monomer having basic nitrogen to provide the polyamide essential to the present invention include the following.

Examples include diamines such as N,N'-bis(aminomethyl)-piperazine, N,N'-bis(β-aminoethyl)-piperazine, N,N'-bis(γ-aminobenzyl)-piperazine, N-(β-aminoethyl)piperazine, N-(β-aminopropyl)piperazine, N-(ω-aminohexyl)piperazine, N-(β-aminoethyl)-2,5-dimethylpiperazine, N,N-bis(β-aminoethyl)-benzylamine, N,N-bis(γ-aminopropyl)-amine, N,N'-dimethyl-N,N'-bis(γ-aminopropyl)-ethylenediamine, and N,N'-dimethyl-N,N'-bis(γ-aminopropyl)-tetramethylenediamine; dicarboxylic acids such as N,N'-bis(carboxymethyl)-piperazine, N,N'-bis(carboxymethyl)-methylpiperazine, N,N'-bis(carboxymethyl)-2,6-dimethylpiperazine, N,N'-bis(β-carboxyethyl)-piperazine, N,N-bis(carboxymethyl)-methylamine, N,N-bis(β-carboxyethyl)-ethylamine, N,N-bis(β-carboxyethyl)-methylamine, N,N-di(β-carboxyethyl)-isopropylamine, N,N'-dimethyl-N,N'-bis-(carboxymethyl)-ethylenediamine, and N,N'-dimethyl-N,N'-bis-(β-carboxyethyl)-ethylenediamine, and lower alkyl esters and acid halides thereof; and ω-amino acids such as N-(aminomethyl)-N'-(carboxymethyl)-piperazine, N-(aminomethyl)-N'-(β-carboxyethyl)-piperazine, N-(β-aminoethyl)-N'-(β-carboxyethyl)-piperazine, N-carboxymethylpiperazine, N-(β-carboxyethyl)piperazine, N-(γ-carboxyhexyl)piperazine, N-(ω-carboxyhexyl)piperazine, N-(aminomethyl)-N-(carboxymethyl)-methylamine, N-(β-aminoethyl)-N-(β-carboxyethyl)-methylamine, N-(aminomethyl)-N-(3-carboxyethyl)-isopropylamine, and N,N'-dimethyl-N-(aminomethyl)-N'-(carboxymethyl)-ethylenediamine.

These monomers may be used in combination with any other diamine, dicarboxylic acid, ω-amino acid, or lactam and polymerized to provide the polyamide of the present invention. The amount of such a monomer component containing basic nitrogen is preferably 10 to 100 mol %, more preferably 10 to 80 mol %, based on the amount of all the components of the polyamide, i.e., the amino carboxylic acid unit (including cases where a lactam is used as a material), the dicarboxylic acid unit, and the diamine structural unit. Too small an amount of the monomer component tends to reduce the compatibility with the compound (A). The resin layer contains a compound (C) having a 5- to 7-membered ring and a polymerizable ethylenic double bond. In general, compounds having a 5- to 7-membered ring, a bulky substituent, act as a high barrier to molecular motion, and therefore the molecular motion of adjacent compounds is also restricted. Hence, the compound (C), when contained in the resin layer, is expected to inhibit crystallization of the component (A), improving the resistance to repeated impacts during printing. Specific examples of such a compound (C) include benzyl (meth)acrylate, cyclohexyl(meth)acrylate, phenoxymethyl(meth)acrylate, phenoxydiethylene glycol(meth)acrylate, styrene and derivatives thereof, N-phenylmaleimide and derivatives thereof, (meth)acrylic acid-2-naphthyl, N-phenyl(meth)acrylamide, and bicyclopentenyl(meth)acrylate.

The compound (C) preferably has at least one functional group selected from at least one hydroxyl group, carboxyl group, and amino group in its molecule. Having such a functional group in the molecule results in interaction with a hydroxyl group of the compound (A) through hydrogen bonding, enhancing the inhibitory effect on crystallization of the compound (A), while also improving the compatibility with the compound (A). Specific examples of such a compound (C) include 2-(meth)acryloyloxyethyl hexahydrophthalate, 2-hydroxy-3-phenoxypropyl(meth)acrylate, 2-(meth)acryloyloxyethyl phthalate, neopentyl glycol-(meth)acrylic acid-benzoic acid ester, 2-acryloyloxyethyl-phthalate, 2-acryloyloxyethyl-2-hydroxyethyl-phthalate, and [4-(hydroxymethyl)cyclohexyl]methyl (meth)acrylate.

The 5- to 7-membered ring in the compound (C) is more preferably a heterocyclic ring. Examples of the element constituting the heterocyclic ring include carbon, nitrogen, oxygen, and sulfur. By being a heterocyclic ring, the 5- to 7-membered ring directly interacts with a hydroxyl group of the compound (A) through hydrogen bonding, enhancing the inhibitory effect on crystallization of the compound (A), while also improving the compatibility with the compound (A), and consequently, the compound (C) is unlikely to bleed out of a composition. Specific examples of such a component (C) include vinylpyridine, 1-vinylimidazole, 2-methyl-1-vinylimidazole, and vinylcarbazole.

Furthermore, the heterocyclic ring is more preferably an aliphatic ring. The aliphatic ring allows molecular motion of the ring system, which facilitates the interaction between a hydroxyl group of the compound (A) and the 5- to 7-membered ring through hydrogen bonding, enhancing the inhibitory effect on crystallization of the compound (A), while also improving the compatibility with the compound (A), and consequently, the compound (C) can be prevented from bleeding out of a photosensitive resin composition. Specific examples of the compound (C) include tetrahydrofurfuryl (meth)acrylate, N-vinyl-2-pyrrolidone, N-(meth)acryloxy succinic acid imide, divinylethyleneurea, divinylpropyleneurea, vinylcaprolactam, 2,2,6,6-tetramethyl-4-piperidyl acrylate, and acryloylmorpholine.

Into the resin layer, a photopolymerization initiator (D) is generally added. Any photopolymerization initiator can be used as long as it can polymerize polymerizable functional groups when subjected to light. In particular, preferred are those which are capable of generating radicals by self-decomposition or hydrogen abstraction upon light absorption. Examples include benzoin alkyl ethers, benzophenones, anthraquinones, benzyls, acetophenones, and diacetyls.

To the resin layer of the present invention, polyhydric alcohols such as ethylene glycol, diethylene glycol, triethylene glycol, glycerin and derivatives thereof, trimethylolpropane and derivatives thereof, trimethylolethane and derivatives thereof, and pentaerythritol and derivatives thereof can also be added as a compatibilizing agent for improving compatibility and flexibility. The amount of such polyhydric alcohols is preferably not more than 30% by mass based on the total amount of the resin layer.

For the amounts of the components, it is preferred that the total amount of (A) to (D) be not less than 50% by mass of the resin layer, and the amounts of (B), (C), and (D) be in the range of 5 to 200 parts by mass, 5 to 200 parts by mass, and 0.1 to 20 parts by mass, respectively, based on 100 parts by mass of (A). In this range, it is likely that the components of the resin layer are prevented from bleeding out of the resin layer; the relief strength of the resulting printing plate improves; appropriate hardness is provided; residues after engraving are reduced; and the removability of the residues is further excellent.

To increase the thermal stability of the resin layer of the present invention, conventionally known polymerization inhibitors can be added. Preferred examples of polymerization inhibitors include phenols, hydroquinones, catechols, and hydroxyamine derivatives. These polymerization inhibitors are generally used in an amount in the range of 0.001 to 5% by mass based on the total amount of the resin layer.

Furthermore, other additives such as dyes, pigments, surfactants, antifoaming agents, UV absorbers, and flavoring agents can be added.

Next, the structure of the resin printing plate precursor for laser engraving according to the present invention will be described again. The resin printing plate precursor for laser engraving according to the present invention has at least a substrate and a resin layer on the substrate.

As the substrate, plastic sheets, for example, of polyester, synthetic rubber sheets, for example, of styrene-butadiene rubber, and metal plates, for example, of steel, stainless steel, and aluminum can be used.

The thickness of the substrate, although not critical, is preferably in the range of 100 to 350 μm from the standpoint of handleability and flexibility. A thickness of not less than 100 μm improves the handleability of the substrate, and a thickness of not more than 350 μm improves the flexibility of the printing plate precursor.

The substrate is preferably subjected to adhesion-improving treatment in order to improve the adhesion to the resin layer. Examples of the method of adhesion-improving treatment include mechanical treatments such as sandblasting, physical treatments such as corona discharge, and chemical treatments such as coating. In particular, adhesion-improving layers formed by coating are preferred from the standpoint of adhesion.

The thickness of the resin layer, in order to provide a sufficient relief depth and improve the printability, is preferably at least 0.3 mm, more preferably at least 0.5 mm.

The printing plate precursor of the present invention preferably has a cover film on the resin layer from the standpoint of surface protection and prevention of attachment of foreign matter and dirt. The resin layer may be in direct contact with the cover film, or there may be one or more layers between a resin layer (G) and a cover film (I). Examples of the layer between the resin layer and the cover film include anti-adhesion layers provided for the purpose of preventing the adhesion of the resin layer surface.

The cover film may be of any material, and plastic sheets, for example, of polyester and polyethylene are preferably used. The thickness of the cover film (I), although not critical, is preferably in the range of 10 to 150 μm from the standpoint of handleability and cost. The cover film surface may be roughened for the purpose of improving the adhesion of an original film.

The method of manufacturing the resin printing plate precursor for laser engraving according to the present invention will now be described. For example, the compound (A) and the compound (B) are dissolved in water/alcohol mixed solvent with heating, and then the compound (C), the photopolymerization initiator (D), and optionally other additives such as plasticizers are added thereto. The resulting mixture is thoroughly mixed with stirring to provide a resin composition solution.

The solution obtained is cast onto a substrate and dried to form a resin layer of the resin composition. In this case, an adhesion-improving layer may be provided on the substrate in advance. Thereafter, a cover film coated with an anti-adhesion layer is bonded onto the resin layer as required, thereby providing a printing plate precursor. Alternatively, the printing plate precursor can be obtained also by preparing a resin sheet by dry forming and laminating a substrate and a cover film such that the resin sheet is sandwiched therebetween.

The printing plate precursor may have a peel assist layer between the cover film and the resin layer for the cover film and the resin layer to be easily peeled off. The peel assist layer may be formed by any method. In terms of ease of thin-film formation, a method is particularly preferred in which a solution of a peel assist layer (L) component in a solvent is applied to the cover film (I), and the solvent is removed. The removal of the solvent can be performed, for example, by hot-air drying, far-infrared drying, or air drying. The solvent to dissolve the peel assist layer (L) component may be any solvent, and water, alcohol, or a mixture of water and alcohol is preferably used.

A method of manufacturing a printing plate using the resin printing plate precursor for laser engraving according to the present invention will now be described. The printing plate of the present invention can be manufactured via sequential steps described below.

Specifically, the method comprises the steps of (1) applying activating light to the resin layer side of a printing plate precursor to polymerize a compound having a double bond, thereby providing a cross-linked printing plate precursor, and then (2) applying patterned laser radiation to the resin layer of the cross-linked plate precursor to engrave a relief.

Optionally, the method may further comprise the following steps: subsequently to the step (2), (3) rinsing the relief surface with water or a liquid containing water to remove residues after engraving produced by laser radiation, (4) drying the relief layer, and furthermore, (5) applying activating light to the relief layer for further cross-linking.

The step (1) is a step of photocrosslinking the resin layer. Examples of the activating light include visible light, ultraviolet light, and electron beams, and ultraviolet light is most common. A lamp that can generally apply light having a wavelength of 300 to 400 nm, such as a high-pressure mercury lamp, an ultra-high pressure mercury lamp, a metal halide lamp, a xenon lamp, a carbon arc lamp, or a chemical lamp, is used. When a transparent cover film that transmits activating light is provided, the step of applying activating light may be performed before or after peeling off the cover film. When the film does not transmit activating light, the irradiation is performed after the peeling off. The activating light may be applied with a plastic film, for example, a vinyl chloride film put on the resin layer and the air removed with a vacuum pump because polymerization inhibition may occur in the presence of oxygen. The activating light may be applied only from the resin layer side, but if the substrate is a transparent film that transmits activating light, the activating light can be applied also from the substrate side.

Cross-linking the resin layer is advantageous in that, firstly, it sharpens the relief formed by laser engraving, and secondly, it reduces the stickiness of residues produced after laser engraving. If an uncrosslinked resin layer is subjected to laser engraving, portions originally not intended are likely to be melted and deformed by the after-heat transferred to the surroundings of laser-irradiated areas, and a sharp relief cannot be achieved. In general, materials with a lower molecular weight have the property of taking the form of a liquid rather than a solid, i.e., being stickier. Residues produced after engraving a crosslinkable relief layer are stickier when materials with a lower molecular weight are used in larger amounts. The compound (C), which is low-molecular-weight, becomes a macromolecule by being cross-linked, and therefore, residues produced after engraving tend to be less sticky.

The step (2) of subjecting the resin layer of the cross-linked plate precursor to laser engraving is carried out, for example, by providing scan illumination to a crosslinkable relief layer with a laser head controlled using a computer based on the digital data of an image to be formed. Upon irradiation with an infrared laser, molecules in the resin layer vibrate to generate heat. When a high-power laser such as a carbon dioxide laser or a YAG laser is used as the infrared laser, a large amount of heat is generated at the laser-irradiated area, and molecules in the resin layer are broken or ionized; consequently, some portion of the resin layer is selectively removed, that is, engraving is achieved. The advantage of laser engraving is that the depth of engraving can be freely selected, which allows a three-dimensionally controlled structure. For example, portions to print fine dots can be engraved shallowly or into a shape with shoulders so that a relief does not fall over under printing pressure. Groove portions to print fine reverse texts can be engraved deeply so that the groove is less likely to be filled with ink, and deformation of reverse texts is prevented.

When residues after engraving are attached to the engraved surface, the step (3) of rinsing the relief surface with a liquid to wash away the residues after engraving may be added as mentioned above. Any liquid may be used, and water and liquids composed mainly of water, which are environmentally-friendly, are suitably used. The rinsing may be carried out, for example, by washing away with a liquid flow, spraying a high-pressure liquid, or brushing the engraved surface in the presence of a liquid using a batch-type or conveyance-type brushing washout machine known as a developing machine for a photosensitive resin letterpress printing plate. If the slime of the residues after engraving cannot be removed, a soap-added rinsing liquid may be used.

When the step (3) of rinsing the engraved surface is performed, it is preferable to add the step (4) of drying the crosslinked relief formed by engraving to evaporate the rinsing liquid.

Furthermore, the step (5) of further cross-linking the crosslinkable relief layer may optionally be added. This additional cross-linking step (5) can strengthen the relief formed by engraving.

The printing plate manufactured using the resin printing plate precursor for laser engraving according to the present invention is most suitably used for letterpress printing and dry offset printing, and can also be used for planographic printing, intaglio printing, and mimeographic printing, and as a photoresist.

EXAMPLES

The present invention will now be described in detail with reference to examples.

Synthesizing Modified Partially Saponified Polyvinyl Acetate

Synthesis Example 1

A partially saponified polyvinyl acetate "KL-05" (degree of polymerization: approximately 500, degree of saponification: 80 mol %) available from Nippon Synthetic Chemical Industry Co., Ltd. was swollen in acetone, and 1.0 mol % of succinic anhydride was added thereto. The resulting mixture was stirred at 60° C. for 6 hours to add carboxyl groups to a molecular side chain. This polymer was washed with acetone to remove unreacted succinic anhydride, and the polymer was further dried. The acid value was measured to be 10.0 mg KOH/g. One hundred parts by mass of the polymer was dissolved in 200 parts by mass of a mixed solvent of ethanol/water (mass ratio: 30/70) at 80° C. Six parts by mass of glycidyl methacrylate was added thereto to introduce reactive groups into the partially saponified polyvinyl acetate. A potentiometric titration analysis demonstrated that 0.24 mol/kg of methacroyl groups were introduced into a polymer side chain as a result of reaction of the carboxyl groups in the polymer with epoxy groups of glycidyl methacrylate, and a modified partially saponified polyvinyl acetate A1, the component (A), was provided.

Synthesis Example 2

A copolymer obtained from 99 mol % of vinyl acetate and 1 mol % of methacrylic acid was saponified to provide an anionically modified polyvinyl acetate having an average degree of polymerization of 650 and a degree of saponification of 75 mol %. One hundred parts by mass of the polymer was dissolved in 200 parts by mass of a mixed solvent of ethanol/water (mass ratio: 30/70) at 80° C. Six parts by mass of glycidyl methacrylate was added thereto to introduce reactive groups into the partially saponified polyvinyl acetate. A potentiometric titration analysis demonstrated that 0.22 mol/kg of methacroyl groups were introduced into a polymer side chain as a result of reaction of the carboxyl groups in the polymer with epoxy groups of glycidyl methacrylate, and a modified partially saponified polyvinyl acetate A2, the component (A), was provided.

Synthesis Example 3

One hundred parts by mass of a partially saponified polyvinyl acetate "KL-05" (degree of polymerization: approximately 500, degree of saponification: 80 mol %) available from Nippon Synthetic Chemical Industry Co., Ltd. was dissolved in 100 parts by mass of water, and 15 parts by mass of N-methylolacrylamide and 1 part by mass of phosphoric acid as an acid catalyst were added thereto. The resulting mixture was stirred at 100° C. for 4 hours to cause reaction, and then water was removed. Furthermore, the resultant was reacted with an acrylic compound having an N-methylol group to provide a modified partially saponified polyvinyl acetate A3, the compound (A).

Synthesizing Polyamide Having Basic Nitrogen

Synthesis Example 4

Into a stainless-steel autoclave, 10 parts by mass of ε-caprolactam, 90 parts by mass of a salt of N-(2-aminoethyl)piperazine and adipic acid, and 100 parts by mass of water were introduced, and the internal air was replaced with nitrogen gas, after which the mixture was heated at 180° C. for 1 hour, and then water was removed to provide a polyamide having basic nitrogen, a water-soluble polyamide resin.

As the compound having a polymerizable ethylenic double bond, those shown in Table 1 were used.

trademark) H-11 (alcohol mixture, available from Japan Alcohol Trading Co., Ltd.) and 200 parts by mass of water at 70° C. for 2 hours, and then 1.5 parts by mass of "Blemmer" (registered trademark) G (glycidyl methacrylate, available from NOF Corporation) was added and mixed for 1 hour. Furthermore, 3 parts by mass of a copolymer of (dimethylaminoethyl methacrylate)/(2-hydroxyethyl methacrylate) at a mass ratio of 2/1 (available from Kyoeisha Chemical Co., Ltd.), 5 parts by mass of "Irgacure" (registered trademark) 651 (benzyldimethylketal, available from Nihon Ciba-Geigy K.K.), 21 parts by mass of "epoxy ester 70PA" (acrylic acid adduct of propylene glycol diglycidyl ether, available from Kyoeisha Chemical Co., Ltd.), and 20 parts by mass of ethylene glycol diglycidyl ether dimethacrylate were added and mixed for 90 minutes. After cooling to 50° C., 0.1 part by mass of "MEGAFACE F-470" (available from DIC Corporation) was added and mixed for 30 minutes to provide a coating solution 2 for adhesion-improving layer (H).

To "Lumirror" (registered trademark) T60 (polyester film, available from Toray Industries, Inc.) with a thickness of 250 m, the coating solution 1 for adhesion-improving layer (H) was applied with a bar coater such that the film thickness after being dried would be 40 μm, and heated in an oven at 180° C. for 3 minutes to remove the solvent. To the coated film, the coating solution 2 for adhesion-improving layer (H) was applied with a bar coater such that the dry thickness would be 30 μm, and heated in an oven at 160° C. for 3 minutes to provide a substrate (F) provided with an adhesion-improving layer (H).

TABLE 1

| | | Number | Name | CAS | Presence of 5- to 7-membered ring |
|---|---|---|---|---|---|
| Compound having polymerizable ethylenic double bond | Corresponding to compound (C) | C1 | 2-Hydroxy-3-phenoxypropyl acrylate | 16969-10-1 | Present |
| | | C2 | Tetrahydrofurfuryl methacrylate | 2399-48-6 | Present |
| | | C3 | 2-Acryloyloxyethyl-2-hydroxyethyl-phthalate | 38056-88-1 | Present |
| | Not corresponding to compound (C) | C'1 | 2-Hydroxy-3-acryloyloxypropyl methacrylate | 1709-71-3 | Not present |
| | | C'2 | Glycerol dimethacrylate | 1830-78-0 | Not present |
| | | C'3 | Polyalkylene glycol (PEG200) diacrylate | 26570-48-9 | Not present |
| | | C'4 | Acrylic acid adduct of propylene glycol diglycidyl ether | 72928-42-8 | Not present |

Preparing Substrate (F) Having Adhesion-Improving Layer (H)

A mixture of 260 parts by mass of "VYLON" (registered trademark) 31SS (solution of unsaturated polyester resin in toluene, available from Toyobo Co., Ltd.) and 2 parts by mass of "PS-8A" (benzoin ethyl ether, available from Wako Pure Chemical Industries, Ltd.) was heated at 70° C. for 2 hours, and then cooled to 30° C. Seven parts by mass of an adduct of one molecule of ethylene glycol diglycidyl ether and two molecules of methacrylic acid was added thereto, and mixed for 2 hours. Furthermore, 25 parts by mass of "CORONATE" (registered trademark) 3015E (solution of polyisocyanate resin in ethyl acetate, available from Nippon Polyurethane Industry Co., Ltd.) and 14 parts by mass of "EC-1368" (industrial adhesive, available from Sumitomo 3M Limited) were added and mixed to provide a coating solution 1 for adhesion-improving layer (H).

Fifty parts by mass of "Gohsenol" (registered trademark) KH-17 (polyvinyl alcohol having a degree of saponification of 78.5 to 81.5 mol %, available from Nippon Synthetic Chemical Industry Co., Ltd.) was mixed with a mixed solvent of 200 parts by mass of "SOLMIX" (registered Preparing Cover Film (I)

To "Lumirror" S10 (polyester film, available from Toray Industries, Inc.) with a thickness of 100 μm roughened to have a surface roughness Ra of 0.1 to 0.6 μm, "Gohsenol" AL-06 (partially saponificated polyvinyl alcohol having a degree of saponification of 91 to 94 mol %, available from Nippon Synthetic Chemical Industry Co., Ltd.) was applied such that the dry thickness would be 1 μm, and dried at 100° C. for 25 seconds to provide a cover film (I) for analog plates.

Evaluation Method

Evaluations in Examples and Comparative Examples were performed by the following methods.

(1) Elongation at Break

A resin printing plate precursor for laser engraving of 10 cm×10 cm was exposed overall (exposure: 2400 mJ/cm$^2$) in an ambient atmosphere using a platemaker DX-A3 (manufactured by Takano Machinery Works Co., Ltd.) equipped with chemical lamps FL20SBL-360 (20 W) (available from Osram Mitsubishi Electric). Thereafter, a cover film (I) was peeled off, and the resin printing plate precursor was rinsed in a brush developing tank of the platemaker for 1.5 minutes with tap water at 25° C., and then dried at 60° C. for 10 minutes. The resin printing plate precursor was exposed overall (exposure: 2400 mJ/cm$^2$) again in an ambient atmosphere using the chemical lamps, and a resin sheet was peeled off an adhesion-improving layer (H) to provide a sheet having a thickness of 600 m. Thereafter, the sheet was cut into a shape with a parallel part width of 10 mm and a parallel part length of 20 mm using an SD lever type sample cutting machine (manufactured by Dumbbell Co., Ltd.) to produce a sheet for measuring an elongation at break.

Thereafter, using a "Tensilon (registered trademark)" universal material testing machine RTM-100 (manufactured by Orientec Co., Ltd.) equipped with a load cell of 100 kgf, the parallel part of the sheet for measurement was set at a chuck distance of 1 cm and pulled at a rate of 100 mm/min to determine the elongation at break. To achieve sufficient printing durability, the elongation at break after curing is preferably at least 300%.

(2) Engravability

A printing plate precursor for laser engraving with a thickness of 600 μm was exposed overall (exposure: 2400 mJ/cm$^2$) from the side of a cover film (I) in an ambient atmosphere using a platemaker DX-A3 (manufactured by Takano Machinery Works Co., Ltd.) equipped with chemical lamps FL20SBL-360 (20 W) (available from Osram Mitsubishi Electric). Thereafter, the polyester film alone of the cover film (I) was peeled off. The surface of the photosensitive printing plate precursor after peeling off is a partially saponified polyvinyl acetate layer with a dry thickness of 1 μm. Laser engraving was performed using Adflex Direct 250L (manufactured by Comtecs Co., Ltd.) (Engraving rate: 1000 cm/sec, Pitch: 10 μm, Top: 10%, Bottom: 100%, Width: 0.3 mm) to form a relief with 1% highlight dots of 133 Lpi (lines per inch).

Thereafter, the printing plate precursor was rinsed with tap water at 25° C. for 1.5 minutes using the platemaker DX-A3, and then dried with a hot-air dryer at 60° C. for 10 minutes. The printing plate precursor was exposed overall (exposure: 2400 mJ/cm$^2$) again in an ambient atmosphere using the chemical lamps to provide a printing plate for evaluating image reproducibility.

For the printing plate obtained, the presence of residues of engraving after rinsing was observed under 25×-loupe magnification, and the depth of 1% dots of 133 Lpi was measured under a laser microscope VK9500 (available from Keyence Corporation).

(3) Evaluation of Crack Occurrence in Relief (Printing Durability)

Five printing plates having a 100% halftone dot of 1 cm×3 cm were each rotated 50,000 times, 100,000 times, 150,000 times, and 200,000 times at a printing pressure of 300 μm using an M-3 printability tester (manufactured by Miyakoshi Printing Machinery Co., Ltd.), after which the relief surface of the printing plate was observed under a 10× light microscope, and the number of printing plates in which a relief crack of 100 μm or more occurred was counted.

Example 1

Preparing Composition Solution 1 for Resin Composition 1

Into a three-necked flask equipped with a stirring paddle and a condenser, the compound (A) and the compound (B) shown in Table 2 were added, and a mixed solvent of 50 parts by mass of "SOLMIX" (registered trademark) H-11 (alcohol mixture, available from Japan Alcohol Trading Co., Ltd.) and 50 parts by mass of water were added, after which the resulting mixture was heated at 90° C. for 2 hours with stirring to dissolve the compound (A) and the compound (B). The mixture was cooled to 70° C., and then other components were added and stirred for 30 minutes to provide a composition solution 1 for resin composition 1.

Producing Resin Sheet 1

The composition solution 1 for resin composition 1 was cast onto a polyester film and dried at 60° C. for 2 hours. The film was peeled off to provide a resin sheet 1 of 650 m. The thickness of the resin sheet 1 was adjusted by scraping out the composition solution 1 extending off a spacer with a given thickness on a substrate using a parallel metal straight-edge.

Producing Resin Printing Plate Precursor 1

The resin composition solution 1 obtained was cast onto the substrate (F) having the adhesion-improving layer (H) and dried at 60° C. for 2.5 hours. In this process, adjustment was performed such that the thickness of a plate (polyester film+resin layer) after being dried would be 0.95 mm. To the resin layer thus obtained, a mixed solvent of water and ethanol at a mass ratio of 50/50 was applied, and the cover film (I) was pressed onto the surface to provide a printing plate precursor. Using the printing plate precursor obtained, the properties of a printing plate were evaluated by the methods described above. The results are shown in Table 3.

Examples 2 to 9, Comparative Examples 1 to 3

A resin sheet and a printing plate precursor were produced in the same manner as in Example 1 except that the composition of the resin composition was changed as shown in Table 2. The evaluation results are shown in Table 3.

TABLE 2

| | | | Example 1 | Example 2 | Example 3 | Example 4 | Example 5 | Example 6 | Example 7 |
|---|---|---|---|---|---|---|---|---|---|
| Composition (parts by mass) | Compound (A) | A1 | 50 | 50 | 50 | 50 | — | — | 50 |
| | | A2 | — | — | — | — | 50 | — | — |
| | | A3 | — | — | — | — | — | 50 | — |
| | Compound (B) | | 7.5 | 7.5 | 7.5 | 7.5 | 7.5 | 7.5 | 7.5 |
| | Compound having polymerizable ethylenic double bond | C1 | 8 | — | — | — | — | — | 10 |
| | | C2 | — | 10 | 10 | 10 | 10 | 10 | — |
| | | C3 | — | — | — | — | — | — | — |
| | | C'1 | 4 | 4 | 8 | 1 | 4 | 4 | — |
| | | C'2 | 10 | 3 | 3 | 6 | 3 | 3 | 7 |
| | | C'3 | — | — | — | — | — | — | — |
| | | C'4 | 6 | 11 | 7 | 11 | 11 | 11 | 11 |
| | Photo- | 2,2-Dimethoxy-1,1- | 1.3 | 1.3 | 1.3 | 1.3 | 1.3 | 1.3 | 1.3 |

TABLE 2-continued

| | | | Example 8 | Example 9 | Comparative Example 1 | Comparative Example 2 | Comparative Example 3 |
|---|---|---|---|---|---|---|---|
| polymerization initiator | diphenylethan-1-one | | | | | | |
| Plasticizer | Pentaerythritol polyoxyethylene ether | | 10 | 10 | 10 | 10 | 10 |
| Polymerization inhibitor | N-(Ammoniumoxy)-N-nitrosophenylamine | | 0.2 | 0.2 | 0.2 | 0.2 | 0.2 |
| UV absorber | 2,4-Di-tert-butyl-6-(5-chloro-2H-1,2,3-benzotriazol-2-yl)phenol | | 0.02 | 0.02 | 0.02 | 0.02 | 0.02 |

| | | | Example 8 | Example 9 | Comparative Example 1 | Comparative Example 2 | Comparative Example 3 |
|---|---|---|---|---|---|---|---|
| Composition (parts by mass) | Compound (A) | A1 | 50 | 51 | 50 | 50 | 50 |
| | | A2 | — | — | — | — | — |
| | | A3 | — | — | — | — | — |
| | Compound (B) | | 7.5 | 8.5 | 7.5 | 7.5 | 7.5 |
| | Compound having polymerizable ethylenic double bond | C1 | — | — | — | — | — |
| | | C2 | 10 | — | — | — | — |
| | | C3 | — | 10 | — | — | — |
| | | C'1 | — | — | 5 | — | — |
| | | C'2 | 7 | 7 | 12 | — | 28 |
| | | C'3 | — | — | 5 | — | — |
| | | C'4 | 11 | 11 | 6 | 28 | — |
| Photo-polymerization initiator | 2,2-Dimethoxy-1,1-diphenylethan-1-one | | 1.3 | 1.3 | 1.3 | 1.3 | 1.3 |
| Plasticizer | Pentaerythritol polyoxyethylene ether | | 10 | 10 | 10 | 10 | 10 |
| Pelymerization inhibitor | N-(Ammoniumoxy)-N-nitrosophenylamine | | 0.2 | 0.2 | 0.2 | 0.2 | 0.2 |
| UV absorber | 2,4-Di-tert-butyl-6-(5-chloro-2H-1,2,3-benzotriazol-2-yl)phenol | | 0.02 | 0.02 | 0.02 | 0.02 | 0.02 |

TABLE 3

| | | Example 1 | Example 2 | Example 3 | Example 4 | Example 5 | Example 6 | Example 7 |
|---|---|---|---|---|---|---|---|---|
| Elongation at break (%) | | 375 | 355 | 312 | 332 | 348 | 382 | 358 |
| Engravability | Residues of engraving after rinsing | Not present | Not present | Not present | Not present | Not present | Not present | Not present |
| | Depth of 1% dot of 133 Lpi (µm) | 83 | 84 | 85 | 84 | 84 | 83 | 83 |
| Relief crack (the number of cracks) | 50,000 rotations | 0 | 0 | 0 | 0 | 0 | 0 | 0 |
| | 100,000 rotations | 0 | 0 | 0 | 0 | 0 | 0 | 0 |
| | 150,000 rotations | 0 | 0 | 0 | 0 | 0 | 0 | 0 |
| | 200,000 rotations | 0 | 0 | 0 | 0 | 0 | 0 | 0 |

| | | Example 8 | Example 9 | Comparative Example 1 | Comparative Example 2 | Comparative Example 3 |
|---|---|---|---|---|---|---|
| Elongation at break (%) | | 325 | 312 | 125 | 110 | 95 |
| Engravability | Residues of engraving after rinsing | Not present | Not present | Not present | Not present | Not present |
| | Depth of 1% dot of 133 Lpi (µm) | 83 | 83 | 84 | 85 | 85 |
| Relief crack (the number of cracks) | 50,000 rotations | 0 | 0 | 1 | 1 | 4 |
| | 100,000 rotations | 0 | 0 | 4 | 3 | 5 |
| | 150,000 rotations | 0 | 0 | 5 | 4 | 5 |
| | 200,000 rotations | 0 | 0 | 5 | 5 | 5 |

The invention claimed is:

1. A method of manufacturing a printing plate, comprising the steps of:
cross-linking a resin printing plate precursor for laser engraving to provide a cross-linked resin printing plate precursor for laser engraving, said resin printing plate precursor for laser engraving comprising:
a substrate and a resin layer on the substrate, the resin layer containing:
(A) a modified partially saponified polyvinyl acetate having reactive groups in its side chain;
(B) a polyamide having basic nitrogen;
(C) a compound having a 5- to 7-membered ring and a polymerizable ethylenic double bond; and (D) a photopolymerization initiator; and applying patterned laser radiation to the cross-linked plate precursor to engrave a relief on the resin layer.

2. The method of manufacturing a printing plate according to claim 1, wherein the compound (C) has a molecular weight of 300 or less.

3. The method of manufacturing a printing plate according to claim 1, wherein the compound (C) has at least one functional group selected from hydroxyl, carboxyl, and amino.

4. The method of manufacturing a printing plate according to claim 1, wherein the 5- to 7-membered ring in the compound (C) comprises a heterocyclic ring.

5. The method of manufacturing a printing plate according to claim 4, wherein the 5- to 7-membered ring in the compound (C) comprises a heterocyclic aliphatic ring.

6. The method of manufacturing a printing plate according to claim 1, wherein the compound (A) comprises a modified partially saponified polyvinyl acetate having a structure in which carboxyl groups are introduced into a polymer side chain by reacting a partially saponifie polyvinyl acetate with an acid anhydride, and reactive groups are introduced by reacting the carboxyl groups with an unsaturated epoxy compound.

7. The method of manufacturing a printing plate according to claim 1, wherein the compound (A) has a structure in which an unsaturated epoxy compound is added to an anionically modified polyvinyl alcohol having a degree of saponification of 60 to 90 mol % obtained by saponifying a copolymer of vinyl acetate with an unsaturated carboxylic acid or sail thereof, or with an unsaturated carboxylic ester.

8. The method of manufacturing a printing plate according to claim 1, wherein the compound (A) has a structure formed by a reaction of a partially saponified polyvinyl acetate with an acrylic compound having an N-methylol group.

9. The method of manufacturing a printing plate according to claim 1, wherein the compound (B) comprises a piperazine ring.

10. The method of manufacturing a printing plate according to claim 1, further comprising rinsing the relief with water or a liquid containing water after applying patterned laser radiation.

* * * * *